(12) United States Patent
Liaw

(10) Patent No.: US 11,916,055 B2
(45) Date of Patent: Feb. 27, 2024

(54) SEMICONDUCTOR STRUCTURE HAVING LOGIC CELLS WITH MULTIPLE CELL HEIGHTS

(71) Applicant: Taiwan Semiconductor Manufacturing Co., Ltd., Hsinchu (TW)

(72) Inventor: Jhon-Jhy Liaw, Zhudong Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 422 days.

(21) Appl. No.: 16/282,679

(22) Filed: Feb. 22, 2019

(65) Prior Publication Data
US 2020/0273851 A1    Aug. 27, 2020

(51) Int. Cl.
| | |
|---|---|
| *H01L 27/02* | (2006.01) |
| *H01L 27/092* | (2006.01) |
| *H03K 19/00* | (2006.01) |
| *H01L 29/161* | (2006.01) |
| *H03K 19/0948* | (2006.01) |
| *H01L 23/522* | (2006.01) |

(52) U.S. Cl.
CPC ...... *H01L 27/0207* (2013.01); *H01L 23/5226* (2013.01); *H01L 27/0924* (2013.01); *H01L 29/161* (2013.01); *H03K 19/0013* (2013.01); *H03K 19/0948* (2013.01)

(58) Field of Classification Search
CPC ............. H01L 27/0207; H01L 27/0924; H01L 29/161; H01L 23/5226; H03K 19/0013; H03K 19/0948
See application file for complete search history.

(56) References Cited

U.S. PATENT DOCUMENTS

| | | | | |
|---|---|---|---|---|
| 10,497,693 | B1* | 12/2019 | Huang | H01L 27/0207 |
| 2005/0198604 | A1* | 9/2005 | Yoshida | H01L 27/0207 |
| | | | | 716/119 |
| 2008/0061441 | A1* | 3/2008 | Liu | H01L 23/5226 |
| | | | | 257/774 |
| 2009/0033368 | A1* | 2/2009 | Pitts | G06F 30/39 |
| | | | | 326/101 |
| 2009/0236633 | A1* | 9/2009 | Chuang | H01L 21/8238 |
| | | | | 257/190 |

(Continued)

FOREIGN PATENT DOCUMENTS

JP        2014236116 A  * 12/2014

*Primary Examiner* — Sophia T Nguyen
*Assistant Examiner* — Scott E Bauman
(74) *Attorney, Agent, or Firm* — Birch, Stewart, Kolasch & Birch, LLP

(57) ABSTRACT

Semiconductor structures are provided. A semiconductor structure includes a plurality of first logic cells having a first cell height, a plurality of second logic cells having a second cell height, and a plurality of metal lines parallel to each other in a metal layer. The second cell height is different than the first cell height. The first logic cells are arranged in odd rows of a cell array, and the second logic cells are arranged in even rows of the cell array. The metal lines covering the first and second logic cells are wider than the metal lines inside the first logic cells, and the metal lines inside the first logic cells are wider than the metal lines inside the second logic cells.

20 Claims, 10 Drawing Sheets

(56) References Cited

U.S. PATENT DOCUMENTS

| | | | |
|---|---|---|---|
| 2011/0147922 A1* | 6/2011 | Bezama | H01L 24/03 |
| | | | 257/737 |
| 2014/0097493 A1* | 4/2014 | Baek | H01L 29/6681 |
| | | | 257/347 |
| 2016/0210390 A1* | 7/2016 | Pan | G06F 30/39 |
| 2016/0351249 A1* | 12/2016 | Liaw | H01L 27/0924 |
| 2017/0098648 A1* | 4/2017 | Lee | H01L 27/1211 |
| 2017/0317100 A1* | 11/2017 | Kang | H01L 27/11807 |
| 2018/0005691 A1* | 1/2018 | Liaw | G11C 8/16 |
| 2018/0075182 A1* | 3/2018 | Zhuang | G06F 30/398 |
| 2018/0358346 A1* | 12/2018 | Kim | H01L 29/42392 |
| 2019/0148407 A1* | 5/2019 | Guo | H01L 27/0924 |
| | | | 257/206 |

* cited by examiner

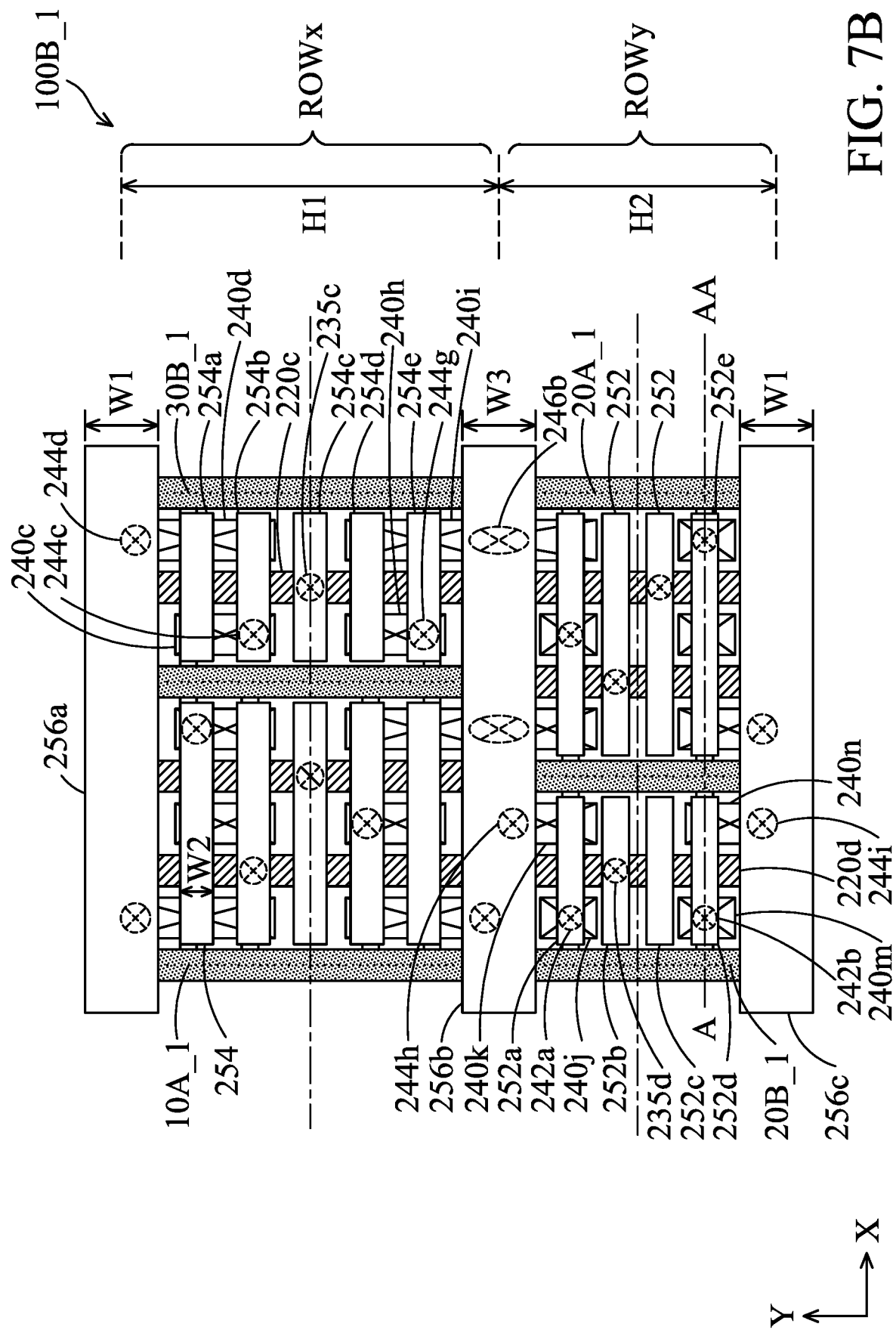

SEMICONDUCTOR STRUCTURE HAVING LOGIC CELLS WITH MULTIPLE CELL HEIGHTS

BACKGROUND

Integrated circuits (ICs) have become increasingly important. Applications using ICs are used by millions of people. These applications include cell phones, smartphones, tablets, laptops, notebook computers, PDAs, wireless email terminals, MP3 audio and video players, and portable wireless web browsers. Integrated circuits increasingly include powerful and efficient on-board data storage and logic circuitry for signal control and processing.

The recent trend in miniaturizing ICs has resulted in smaller devices which consume less power, yet provide more functionality at higher speeds than before. The miniaturization process has also resulted in various developments in IC designs and/or manufacturing processes to ensure the desired production yield and the intended performance.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

FIGS. 7A through 7B illustrate block diagrams of a layout of features of the logic cells in the cell array, in accordance with some embodiments of the disclosure.

DETAILED DESCRIPTION

Figure 1:
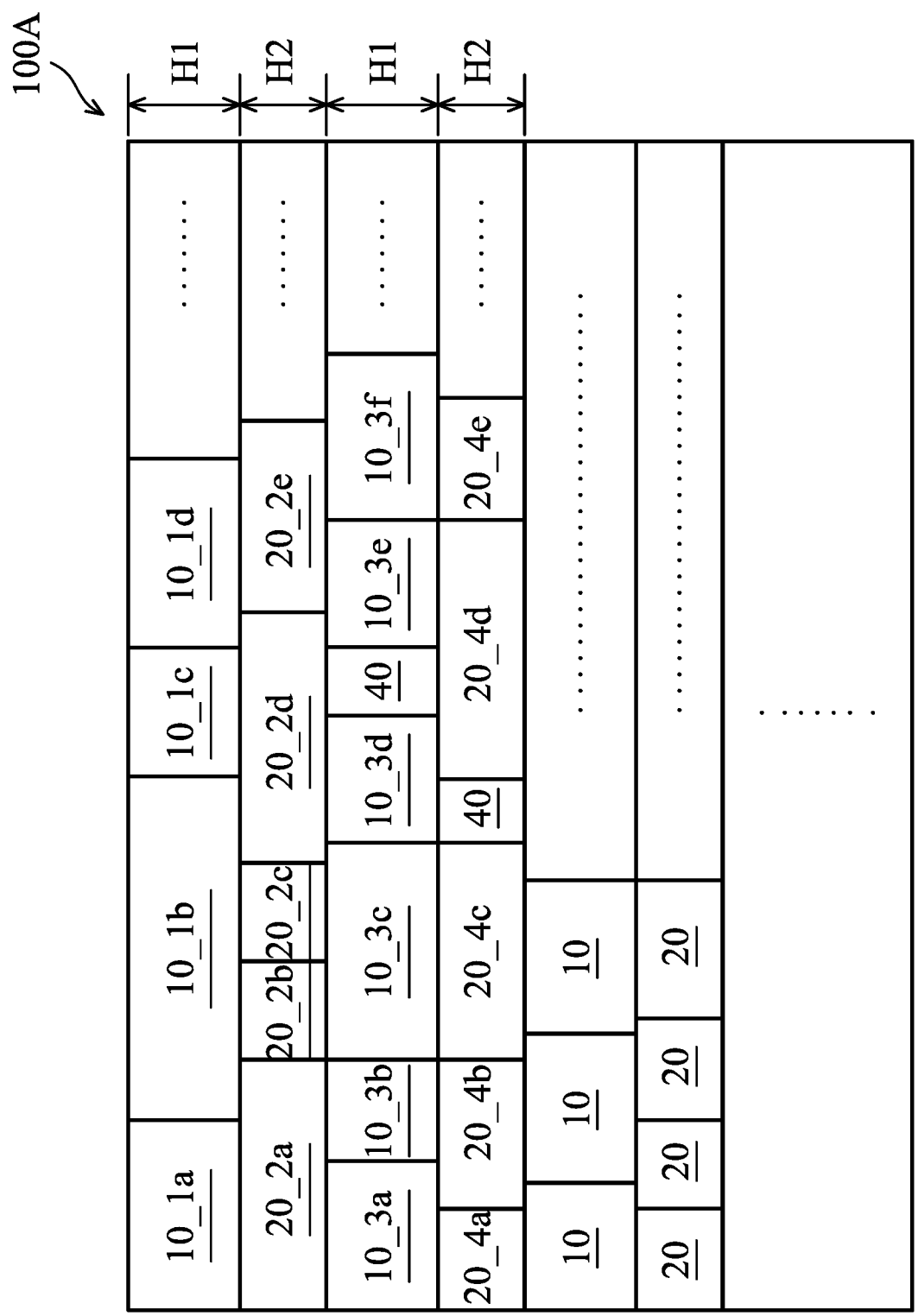
FIG. 1 is a simplified diagram of a cell array of an IC, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and second nodes are formed in direct contact, and may also include embodiments in which additional nodes may be formed between the first and second nodes, such that the first and second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

FIG. 1 is a simplified diagram of a cell array 100A of an IC, in accordance with some embodiments of the disclosure. The cell array 100A includes multiple first logic cells 10 and multiple second logic cells 20. In some embodiments, the first logic cells 10 and the second logic cells 20 are the standard cells (e.g., INV (inverter), AND, OR, NAND, NOR, Flip-Flop, SCAN, etc.), a combination thereof or specific functional cells. Furthermore, the logic functions of the first logic cells 10 and the second logic cells 20 may be the same or different. Furthermore, each of the first logic cells 10 and the second logic cells 20 includes multiple transistors. In some embodiments, the first logic cells 10 and the second logic cells 20 corresponding to the same function or operation may have the same circuit configuration with different semiconductor structures and/or different layouts.

In FIG. 1, the first logic cells 10 have the same cell width H1 (e.g., along Y-direction) in the layout, and the second logic cells 20 have the same cell height H2 (e.g., along Y-direction) in the layout. The cell width H1 of the first logic cells 10 is higher than the cell width H2 of the second logic cells 20. In some embodiments, the dimension ratio of the cell width H1 to the cell width H2 is within a range of 1.1 to 2. Furthermore, the first logic cells 10 and the second logic cells 20 may have the same or different cell widths (e.g., along X-direction) in the layout. It should be noted that the number and the configuration of the first logic cells 10 and the second logic cells 20 are used as an example, and not to limit the disclosure.

In some embodiments, the first logic cells 10 are arranged in odd rows of the cell array 100A. For example, the first logic cells 10_1a through 10_1d are arranged in the first row of the cell array 100A, and the first logic cells 10_3a through 10_3f are arranged in the third row of the cell array 100A. Furthermore, the second logic cells 20 are arranged in even rows of the cell array 100A. For example, the second logic cells 20_2a through 20_2e are arranged in the second row of the cell array 100A, and the second logic cells 20_4a through 20_4e are arranged in the fourth row of the cell array 100A.

In some embodiments, the first logic cells 10 are arranged in even rows of the cell array 100A, and the second logic cells 20 are arranged in odd rows of the cell array 100A.

In some embodiments, the cells other than the first logic cells 10 and the second logic cells 20 are arranged in the rows of the cell array 100A. For example, the cell 40 is arranged between the first logic cells 10_3d and 10_3e in the third row of the cell array 100A, and another cell 40 is arranged between the second logic cells 20_4c and 20_4d in the fourth row of the cell array 100A. In some embodiments, the cell 40 is a dummy cell or a well tap cell.

In some embodiments, the transistors in the first logic cells 10 and the second logic cells 20 are selected from a group consisting of fin field effect transistors (FinFETs) structure, vertical gate all around (GAA), horizontal GAA, nano wire, nano sheet, or a combination thereof. In some embodiments, the fin number of each transistor in the first logic cell 10 is greater than the fin number of each transistor in the second logic cell 20.

In some embodiments, the first logic cells 10 (or the second logic cells 20) in the same row are electrically isolated from each other by the isolation region, e.g., the shallow trench isolation (STI). In some embodiments, the first logic cells 10 (or the second logic cells 20) in the same row are electrically isolated by the transistors.

Figure 2A:
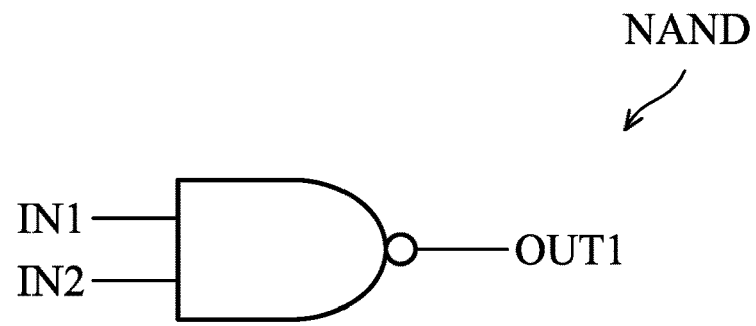
FIG. 2A illustrates the logic symbol of the standard cell NAND.
Figure 2B:
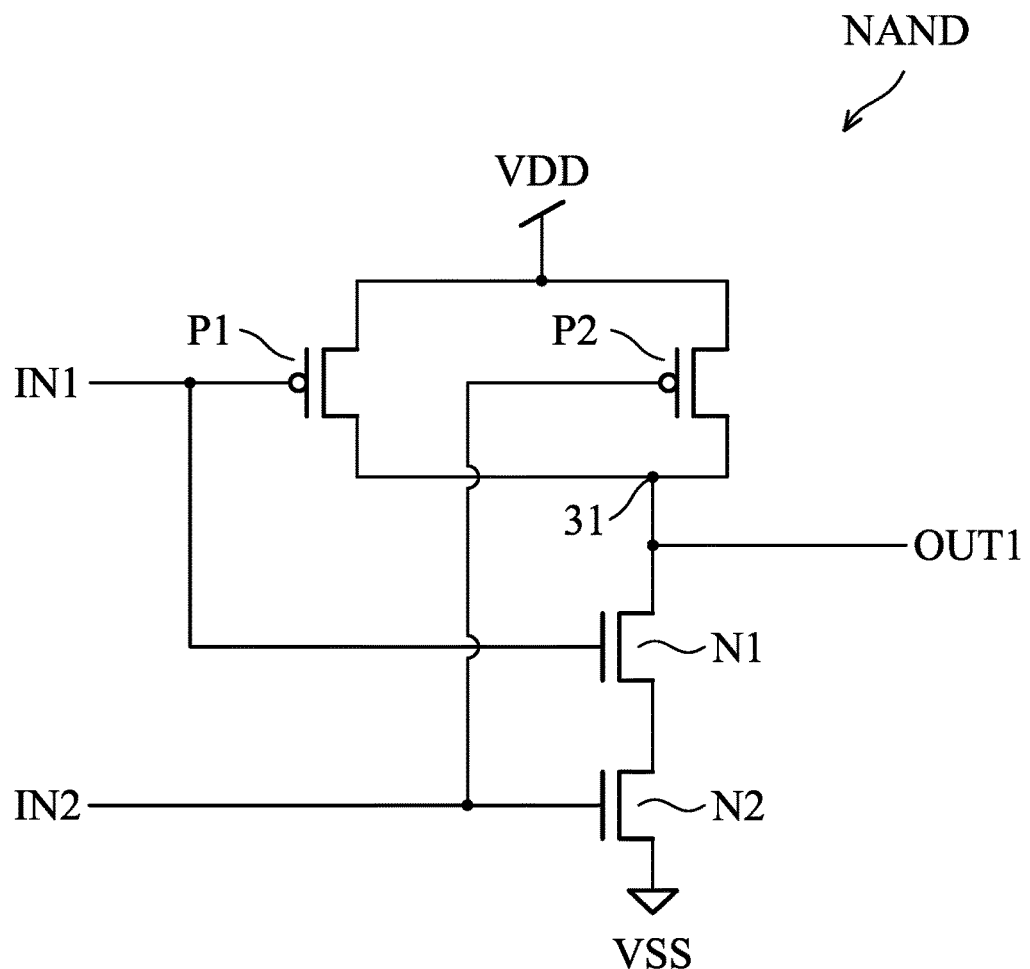
FIG. 2B is a circuit diagram of the standard cell NAND in FIG. 2A.

FIG. 2A illustrates the logic symbol of the standard cell NAND. FIG. 2B is a circuit diagram of the standard cell NAND in FIG. 2A. The standard cell NAND is a logic gate configured to provide an output signal OUT1 according two input signals IN1 and IN2. The standard cell NAND includes two PMOS transistors P1 and P2 and two NMOS transistors N1 and N2. In some embodiments, the two PMOS transistors P1 and P2 and two NMOS transistors N1 and N2 may be fin field effect transistors (FinFETs) with single fin or multiple-fin.

In the standard cell NAND, the PMOS transistors P1 and P2 are coupled in parallel between a node 31 and a power supply VDD. The NMOS transistor N1 is coupled between the node 31 and the NMOS transistor N2, and the NMOS transistor N2 is coupled between the NMOS transistor N1 and a ground VSS. The input signal IN1 is input to the gates of the PMOS transistor P1 and the NMOS transistor N1, and the input signal IN2 is input to the gates of the PMOS transistor P2 and the NMOS transistor N2. Furthermore, the output signal OUT1 is provided at the node 31.

Figure 3A:
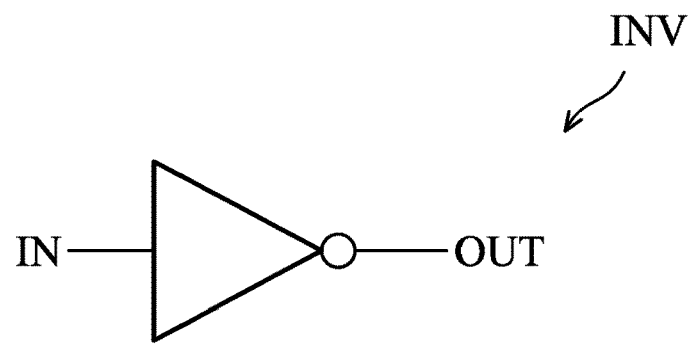
FIG. 3A illustrates the logic symbol of the standard cell INV (i.e., inverter).
Figure 3B:
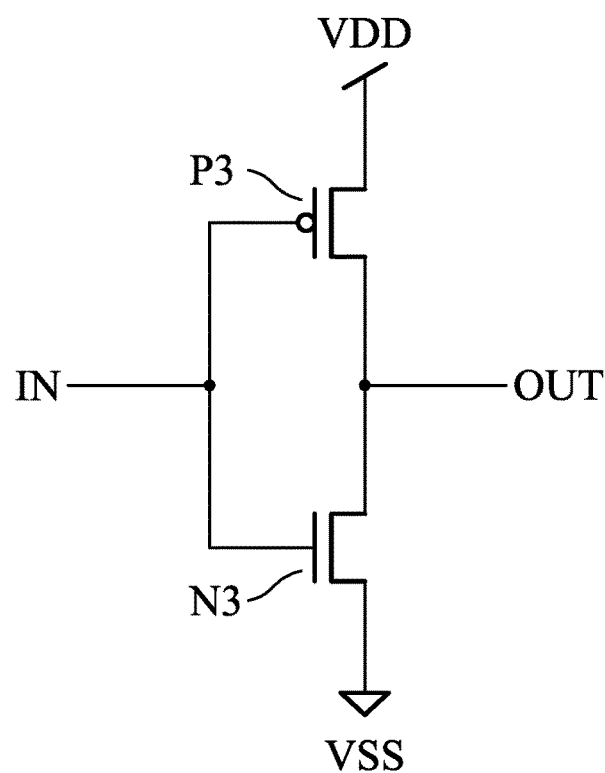
FIG. 3B is a circuit diagram of the standard cell INV in FIG. 3A.

FIG. 3A illustrates the logic symbol of the standard cell INV (i.e., inverter). FIG. 3B is a circuit diagram of the standard cell INV in FIG. 3A. The standard cell INV is a logic gate configured to inverting an input signal IN to provide an output signal OUT1. The standard cell INV includes a PMOS transistor P3 and an NMOS transistor N3. In some embodiments, the PMOS transistor P3 and the NMOS transistors N3 may be FinFETs with single fin or multiple-fin.

In the standard cell INV, the PMOS transistor P3 is coupled between the NMOS transistor N3 and a power supply VDD. The NMOS transistor N3 coupled between the PMOS transistor P3 and a ground VSS. The input signal IN is input to the gates of the PMOS transistor P3 and the NMOS transistor N3. Furthermore, the output signal OUT is provided at the drains of the NMOS transistor N3 and the PMOS transistor P3.

Figure 4A:
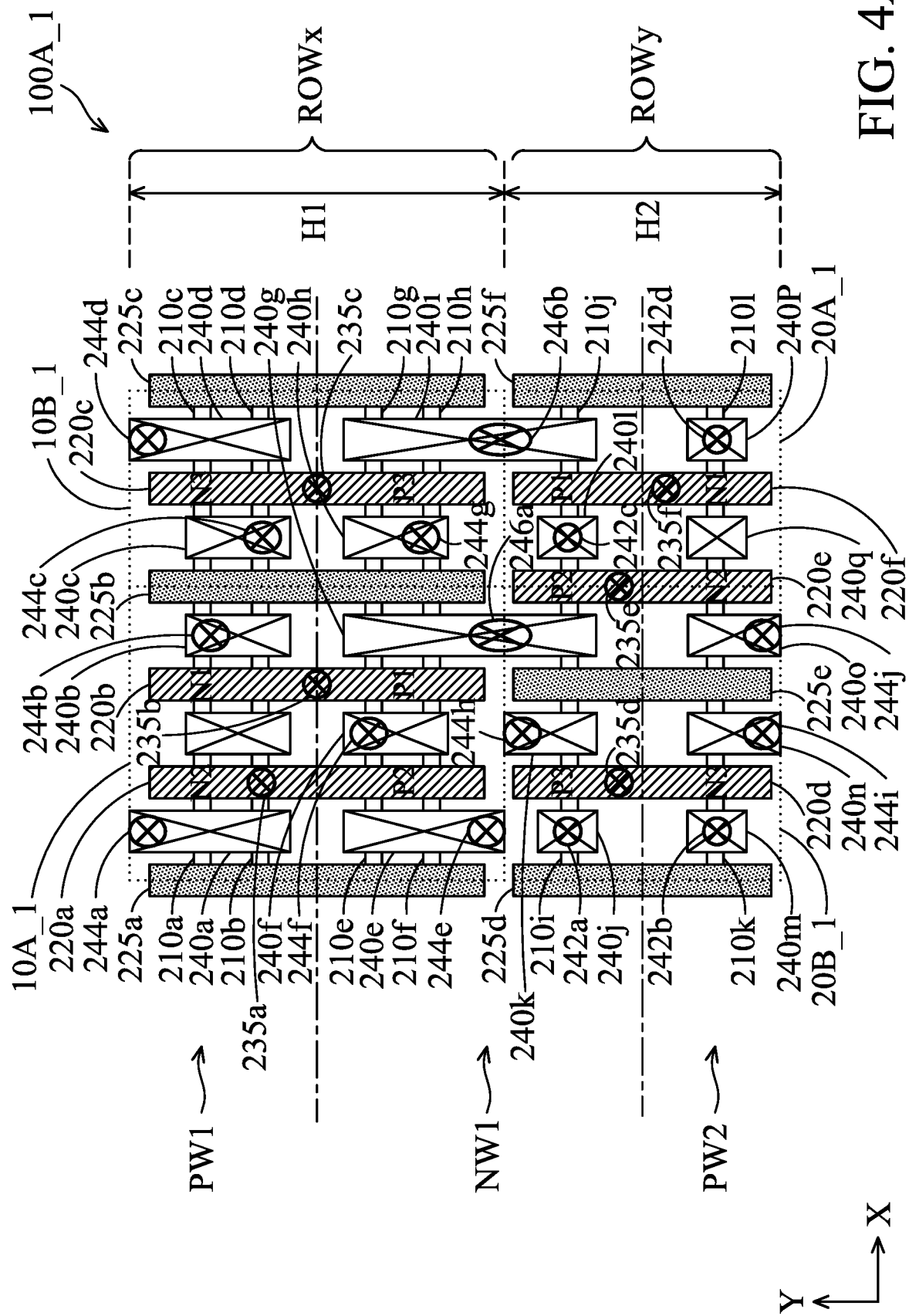
FIGS. 4A through 4C illustrate block diagrams of a layout of features of the logic cells in the cell array, in accordance with some embodiments of the disclosure.
Figure 4B:
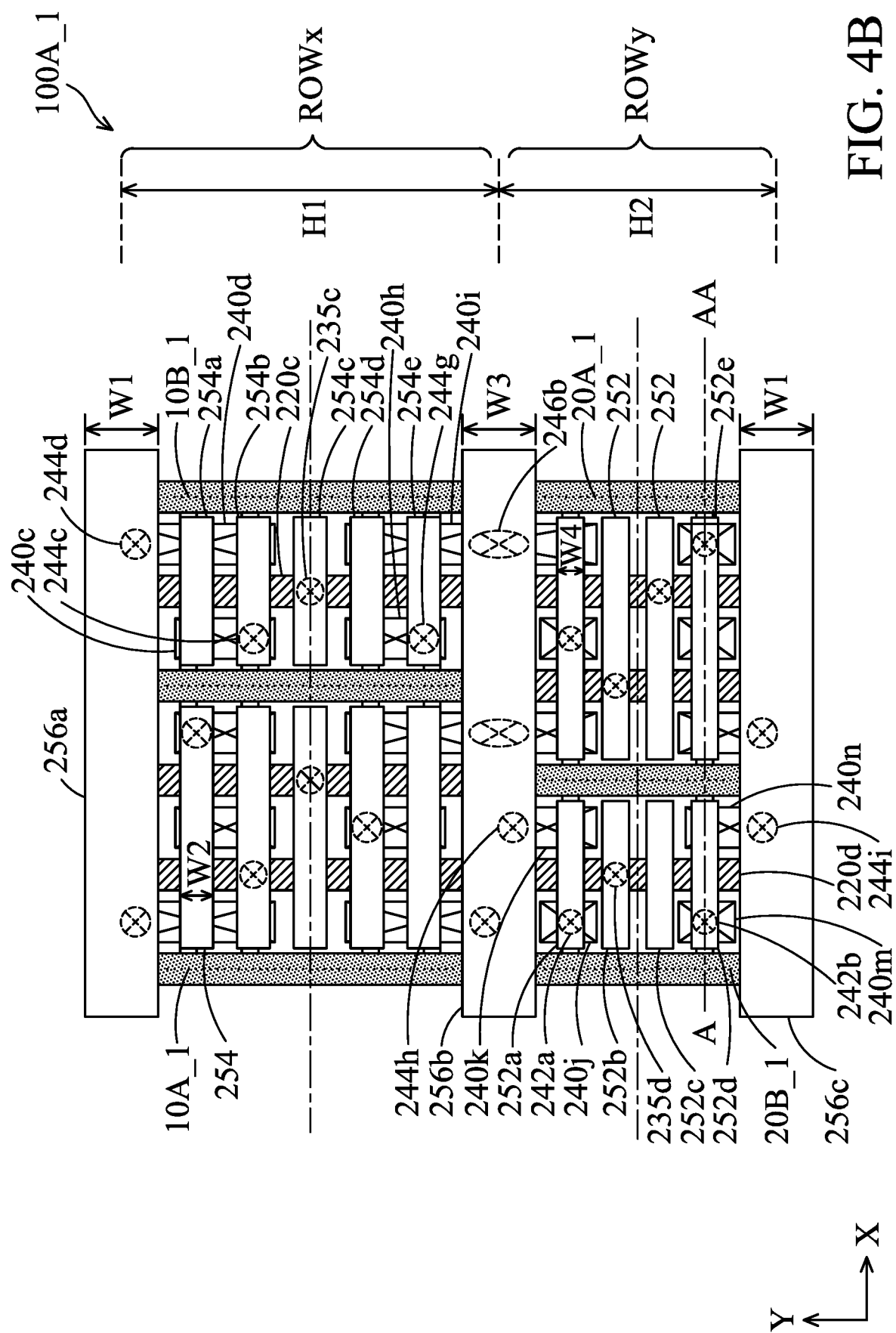
Figure 4C:
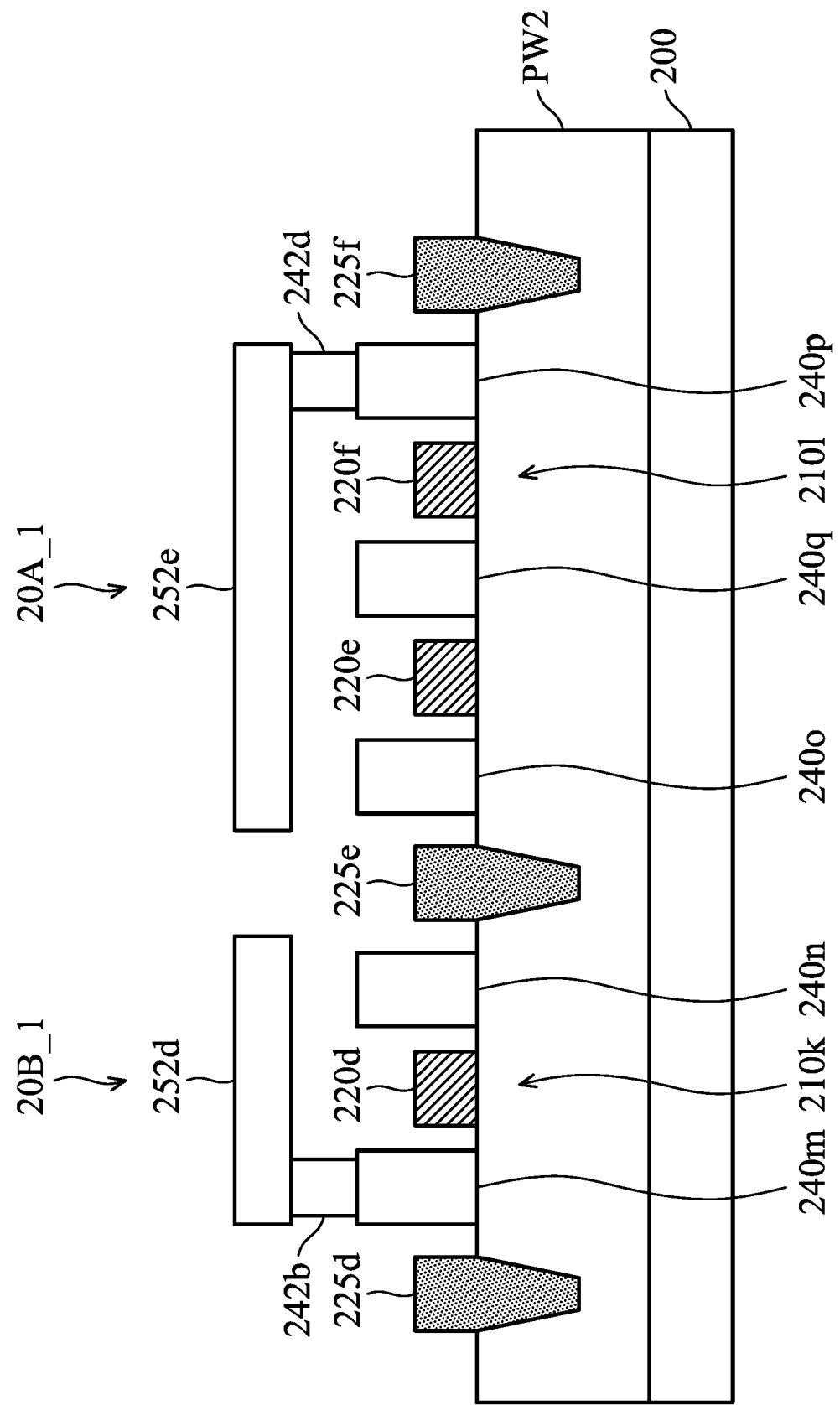

FIGS. 4A through 4C illustrate block diagrams of a layout of features of the logic cells in the cell array 100A_1, in accordance with some embodiments of the disclosure. FIGS. 4A and 4B illustrates features in various levels of the cell array 100A_1.

FIG. 4A shows features of the cell array 100A_1 in a via level and lower. In FIG. 4A, the first logic cells 10A_1 and 10B_1 are arranged in the row ROWx of the cell array 100A_1, and the second logic cells 20A_1 and 20B_1 are arranged in the ROWy of the cell array 100A_1. Furthermore, the outer boundary of each of the logic cells 10A_1, 10B_1, 20A_1 and 20B_1 is illustrated using dashed lines. As described above, the cell height H1 of the first logic cells 10A_1 and 10B_1 is higher than the cell height H2 of the second logic cells 20A_1 and 20B_1. It should be noted that the configuration of the logic cells 10A_1, 10B_1, 20A_1 and 20B_1 in the rows ROWx and ROWy is used as an illustration, and not to limit the disclosure.

In FIG. 4A, the standard cell NAND of FIGS. 2A and 2B is implemented in the first logic cell 10A_1 and the second logic cell 20A_1. Furthermore, the standard cell INV of FIGS. 3A and 3B is implemented in the first logic cell 10B_1 and the second logic cell 20B_1. In the embodiment, the transistors of the first logic cells 10A_1 and 10B_1 are dual-fin FETs, and the transistors of the second logic cells 20A_1 and 20B_1 are single-fin FETs.

In some embodiments, the single-fin FETs are formed by removing an extra fin from multiple fins using lithography/etch steps. In some embodiments, the first logic cell 10 including dual-fin FETs are used in high-speed circuits. Furthermore, the second logic cell 20 including single-fin FETs are used in non speed-critical circuits to obtain lower leakage and lower power consumption. Therefore, the cell array 100A_1 has better cell performance and lower power consumption.

In the first logic cell 10A_1, the semiconductor fins 210a and 210b extending in the X-direction are formed over the P-type well region PW1, and the semiconductor fins 210e and 210f extending in the X-direction are formed over the N-type well region NW1. A metal gate electrode 220a extending in the Y-direction forms the PMOS transistor P2 with an underlying active region formed by the semiconductor fins 210e and 210f over the N-type well region NW1. In some embodiments, each of the semiconductor fins 210e and 210f overlapping the metal gate electrode 220a may serve as a SiGe channel region of the PMOS transistor P2. In some embodiments, the Ge atomic concentration of the SiGe channel region of the PMOS transistor P2 is within a range of 5%~50%. Furthermore, the metal gate electrode 220a forms the NMOS transistor N2 with an underlying active region formed by the semiconductor fins 210a and 210b in the P-type well region PW1. In other words, the metal gate electrode 220a is shared by the NMOS transistor N2 and the PMOS transistor P2. Furthermore, the metal gate electrode 220a is connected to an overlying level through the gate via 235a for receiving the input signal IN2 of the standard cell NAND corresponding to the first logic cell 10A_1.

In the first logic cell 10A_1, a metal gate electrode 220b extending in the Y-direction forms the PMOS transistor P1 with an underlying active region formed by the semiconductor fins 210e and 210f over the N-type well region NW1. In some embodiments, each of the semiconductor fins 210e and 210f overlapping the metal gate electrode 220b may serve as a SiGe channel region of the PMOS transistor P1. In some embodiments, the Ge atomic concentration of the SiGe channel region of the PMOS transistor P1 is within a range of 5%~50%. Furthermore, the metal gate electrode 220b forms the NMOS transistor N1 with an underlying active region formed by the semiconductor fins 210a and 210b in the P-type well region PW1. In other words, the metal gate electrode 220b is shared by the NMOS transistor N1 and the PMOS transistor P1. Furthermore, the metal gate electrode 220b is connected to an overlying level through the gate via 235b for receiving the input signal IN1 of the standard cell NAND corresponding to the first logic cell 10A_1.

In the first logic cell 10A_1, the dielectric-base gates 225a and 225b extending in the Y-direction are dummy gates. The gate electrodes 220a and 220b are arranged between the dielectric-base dummy gates 225a and 225b, and the NMOS transistors N1 and N2 and the PMOS transistors P1 and P2 are surrounded by the dielectric-base dummy gates 225a and 225b. In other words, the dielectric-base dummy gates 225a and 225b are arranged in the boundary of the first logic cell 10A_1. Furthermore, each of the dielectric-base dummy gates 225a and 225b is a single gate with dielectric material. In some embodiments, each of the dielectric-base dummy gates 225a and 225b is a dual-gate with dielectric material.

In the first logic cell 10A_1, the source region of the PMOS transistor P1 is coupled to an overlying level through the contact 240g and the third via 246a for coupling the power supply VDD. Similarly, the source region of the PMOS transistor P2 is coupled to an overlying level through the contact 240e and the second via 244e for coupling the power supply VDD. Furthermore, the source region of the NMOS transistor N2 is coupled to an overlying level through the contact 240a and the second via 244a for coupling the ground VSS. The drain regions of the PMOS transistors P1 and P2 are coupled to an overlying level through the contact 240f and the second via 244f. The drain region of the NMOS transistor N1 is coupled to an overlying level through the contact 240b and the second via 244b. In some embodiments, the drain regions of the PMOS transistors P1 and P2 are coupled to the drain region of the NMOS transistor N1 through the contacts 240f and 240b, the second vias 244f and 244b and the corresponding overlying levels.

In the first logic cell 10B_1, the semiconductor fins 210c and 210d extending in the X-direction are formed over the P-type well region PW1, and the semiconductor fins 210g and 210h extending in the X-direction are formed over the N-type well region NW1. A metal gate electrode 220c extending in the Y-direction forms the PMOS transistor P3 with an underlying active region formed by the semiconductor fins 210g and 210h over the N-type well region NW1. In some embodiments, each of the semiconductor fins 210g and 210h overlapping the metal gate electrode 220c may serve as a SiGe channel region of the PMOS transistor P3. In some embodiments, the Ge atomic concentration of the SiGe channel region of the PMOS transistor P3 is within a range of 5%~50%.

Furthermore, the metal gate electrode 220c forms the NMOS transistor N3 with an underlying active region formed by the semiconductor fins 210c and 210d in the P-type well region PW1. In other words, the metal gate electrode 220c is shared by the NMOS transistor N3 and the PMOS transistor P3. Furthermore, the metal gate electrode 220c is connected to an overlying level through the gate via 235c for receiving the input signal IN of the standard cell INV corresponding to the first logic cell 10B_1.

In the first logic cell 10B_1, the dielectric-base gates 225b and 225c extending in the Y-direction are dummy gates. The gate electrode 220c is arranged between the dielectric-base dummy gates 225b and 225c, and the NMOS transistor N3 and the PMOS transistor P3 are surrounded by the dielectric-base dummy gates 225b and 225c. In other words, the dielectric-base dummy gates 225b and 225c are arranged in the boundary of the first logic cell 10B_1. Furthermore, each of the dielectric-base dummy gates 225b and 225c is a single gate with dielectric material. In some embodiments, each of the dielectric-base dummy gates 225b and 225c is a dual-gate with dielectric material. Moreover, the dielectric-base dummy gate 225b is shared by the first logic cells 10A_1 and 10B_1, i.e., the first logic cells 10A_1 and 10B_1 in the same row ROWx are isolated (or separated) from each other by the dielectric-base dummy gate 225b.

In the first logic cell 10B_1, the source region of the PMOS transistor P3 is coupled to an overlying level through the contact 240i and the third via 246b for coupling the power supply VDD. Furthermore, the source region of the NMOS transistor N3 is coupled to an overlying level through the contact 240d and the second via 244d for coupling the ground VSS. The drain regions of the PMOS transistor P3 is coupled to an overlying level through the contact 240h and the second via 244g. The drain region of the NMOS transistor N3 is coupled to an overlying level through the contact 240c and the second via 244c. In some embodiments, the drain region of the PMOS transistor P3 is coupled to the drain region of the NMOS transistor N3 through the contacts 240c and 240h, the second vias 244c and 244g and the corresponding overlying levels. In some embodiments, the drain regions of the PMOS transistor P3 and the NMOS transistor N3 are coupled together through the same long contact.

In the second logic cell 20A_1, the semiconductor fin 210l extending in the X-direction is formed over the P-type well region PW2, and the semiconductor fin 210j extending in the X-direction is formed over the N-type well region NW1. A metal gate electrode 220e extending in the Y-direction forms the PMOS transistor P2 with an underlying active region formed by the semiconductor fin 210j over the N-type well region NW1. In some embodiments, the semiconductor fin 210j overlapping the metal gate electrode 220e may serve as a SiGe channel region of the PMOS transistor P2. In some embodiments, the Ge atomic concentration of the SiGe channel region of the PMOS transistor P2 is within a range of 5%~50%. Furthermore, the metal gate electrode 220e forms the NMOS transistor N2 with an underlying active region formed by the semiconductor fin 210l in the P-type well region PW2. In other words, the metal gate electrode 220e is shared by the NMOS transistor N2 and the PMOS transistor P2. Furthermore, the metal gate electrode 220e is connected to an overlying level through the gate via 235e for receiving the input signal IN2 of the standard cell NAND corresponding to the second logic cell 20A_1.

In the second logic cell 20A_1, a metal gate electrode 220f extending in the Y-direction forms the PMOS transistor P1 with an underlying active region formed by the semiconductor fin 210j over the N-type well region NW1. In some embodiments, the semiconductor fin 210j overlapping the metal gate electrode 220f may serve as a SiGe channel region of the PMOS transistor P1. In some embodiments, the Ge atomic concentration of the SiGe channel region of the PMOS transistor P1 is within a range of 5%~50%. Furthermore, the metal gate electrode 220f forms the NMOS transistor N1 with an underlying active region formed by the semiconductor fin 210l in the P-type well region PW2. In other words, the metal gate electrode 220f is shared by the NMOS transistor N1 and the PMOS transistor P1. Furthermore, the metal gate electrode 220f is connected to an overlying level through the gate via 235f for receiving the input signal IN1 of the standard cell NAND corresponding to the second logic cell 20A_1.

In the second logic cell 20A_1, the dielectric-base gates 225e and 225f extending in the Y-direction are dummy gates. The gate electrodes 220e and 220f are arranged between the dielectric-base dummy gates 225e and 225f, and the NMOS transistors N1 and N2 and the PMOS transistors P1 and P2 are surrounded by the dielectric-base dummy gates 225e and 225f. In other words, the dielectric-base dummy gates 225e and 225f are arranged in the boundary of the second logic cell 20A_1. Furthermore, each of the dielectric-base dummy gates 225e and 225f is a single gate with dielectric material. In some embodiments, each of the dielectric-base dummy gates 225e and 225f is a dual-gate with dielectric material.

In the second logic cell 20A_1, the source region of the PMOS transistor P1 is coupled to an overlying level through the contact 240i and the third via 246b for coupling the power supply VDD. Similarly, the source region of the PMOS transistor P2 is coupled to an overlying level through the contact 240g and the third via 246a for coupling the power supply VDD. Furthermore, the source region of the NMOS transistor N2 is coupled to an overlying level through the contact 240o and the second via 244j for coupling the ground VSS. The drain regions of the PMOS transistors P1 and P2 are coupled to an overlying level through the contact 240l and the first via 242c. The drain region of the NMOS transistor N1 is coupled to an overlying level through the contact 240p and the first via 242d. In some embodiments, the drain regions of the PMOS transistors P1 and P2 are coupled to the drain region of the NMOS transistor N1 through the contacts 240l and 240p, the second vias 242c and 242d and the corresponding overlying levels.

In the second logic cell 20B_1, the semiconductor fin 210k extending in the X-direction is formed over the P-type well region PW2, and the semiconductor fin 210i extending in the X-direction is formed over the N-type well region NW1. A metal gate electrode 220d extending in the Y-direction forms the PMOS transistor P3 with an underlying active region formed by the semiconductor fin 210i over the N-type well region NW1. In some embodiments, the semiconductor fin 210i overlapping the metal gate electrode 220d may serve as a SiGe channel region of the PMOS transistor P3. In some embodiments, the Ge atomic concentration of the SiGe channel region of the PMOS transistor P3 is within a range of 5%~50%. Furthermore, the metal gate electrode 220d forms the NMOS transistor N3 with an underlying active region formed by the semiconductor fin 210k in the P-type well region PW2. In other words, the metal gate electrode 220d is shared by the NMOS transistor N3 and the PMOS transistor P3. Furthermore, the metal gate electrode 220d is connected to an overlying level through the gate via 235d for receiving the input signal IN of the standard cell INV corresponding to the second logic cell 20B_1.

In the second logic cell 20B_1, the dielectric-base gates 225d and 225e extending in the Y-direction are dummy gates. The gate electrode 220d is arranged between the dielectric-base dummy gates 225d and 225e, and the NMOS transistor N3 and the PMOS transistor P3 are surrounded by the dielectric-base dummy gates 225d and 225e. In other words, the dielectric-base dummy gates 225d and 225e are arranged in the boundary of the second logic cell 20B_1. Furthermore, each of the dielectric-base dummy gates 225d and 225e is a single gate with dielectric material. In some embodiments, each of the dielectric-base dummy gates 225d and 225e is a dual-gate with dielectric material. Furthermore, the dielectric-base dummy gate 225e is shared by the second logic cells 20A_1 and 20B_1, i.e., the second logic cells 20A_1 and 20B_1 in the same row ROWy are isolated (or separated) from each other by the dielectric-base dummy gate 225e.

In the second logic cell 20B_1, the source region of the PMOS transistor P3 is coupled to an overlying level through the contact 240k and the second via 244h for coupling the power supply VDD. Furthermore, the source region of the NMOS transistor N3 is coupled to an overlying level through the contact 240n and the second via 244i for coupling the ground VSS. The drain regions of the PMOS transistor P3 is coupled to an overlying level through the contact 240j and the first via 242a. The drain region of the NMOS transistor N3 is coupled to an overlying level through the contact 240m and the first via 242b. In some embodiments, the drain region of the PMOS transistor P3 is coupled to the drain region of the NMOS transistor N3 through the contacts 240j and 240m, the first vias 242a and 242b and the corresponding overlying levels. In some embodiments, the drain regions of the PMOS transistor P3 and the NMOS transistor N3 are coupled together through the same contact.

In some embodiments, the first vias 242a through 242d, the second vias 244a through 244j and the third vias 246a and 246b are formed in the same via layer, and have a specific shape in layout, e.g., a circular shape or a square shape. Furthermore, size of the third vias 246a and 246b is greater than that of the second vias 244a through 244j, and size of the second vias 244a through 244j is greater than that of the first vias 242a through 242d. For example, in the row ROWy of the cell array 110A, the third vias 246a and 246b have greater size (e.g., the greater diameter) than the second vias 244h, 244i and 244j, and the second vias 244h, 244i and 244j have greater size (e.g., the greater diameter) than the first vias 242a through 242d. In some embodiments, the size ratio of the second vias 244a through 244j to the first vias 242a through 242d is greater than 1.05, that is, the via size of the second vias 244a through 244j is greater than that of the first vias 242a through 242d at least 5%.

In some embodiments, the contacts 240a through 240p have slot shape, and the length ration of longer side to shorter side is greater than 2. Furthermore, the material of the contacts 240a through 240p include multiple metal material composition. In some embodiments, the materials of the contacts 240a through 240p are selected from a group consisting of Ti, TiN, TaN, Co, Ru, Pt, W, Al, Cu, or a combination thereof.

FIG. 4B shows features of the cell array 100A_1 in a metal level and lower. A plurality of metal lines 256a through 256c extending in the X-direction are positioned between the rows of the cell array 100A_1. For example, the metal line 256a with the line width W1 is positioned over the boundary of the row ROWx and the row (not shown) above the ROWx. The metal line 256b with the line width W3 is positioned over the boundary of the rows ROWx and ROWy, for example, the metal line 256b covers the first logic cells 10A_1 and 10B_1 and the second logic cells 20A_1 and 20B_1. The metal line 256c with the line width W1 is positioned over the boundary of the row ROWy and the row (not shown) below the ROWy. In some embodiments, the line widths W1 and W3 are the same.

In FIG. 4B, a plurality of metal lines 254 having the line width W2 and extending in the X-direction are positioned inside the row ROWx of the cell array 100A_1 and between the metal lines 256a and 256b. In some embodiments, the line width W2 is less than the line widths W1 and W3. In some embodiments, the width ratio of the line width W1 or W3 to the line width W2 is greater than 1.2. In some embodiments, the line width W2 is within a range of 5 nm~20 nm. Taking the first logic cell 10B_1 as an example to illustrate, five metal lines 254a through 254e with the line width W2 are positioned inside the first logic cell 10B_1 and between the metal lines 256a and 256b. In the first logic cell 10B_1, the metal line 256a is coupled to the contact 240d through the second via 244d, and the metal line 256b is coupled to the contact 240i through the third via 246b. Furthermore, the metal line 254a is arranged between the metal line 256a and the metal line 254b, and the metal line 254b is coupled to the contact 240c through the second via 244c. The metal line 254c is arranged between the metal lines 254b and 254d, and the metal line 254c is coupled to the metal gate electrode 220c through the gate via 235a. The metal line 254e is arranged between the metal line 254d and metal line 256b, and the metal line 254e is coupled to the contact 240h through the second via 244g.

In FIG. 4B, a plurality of metal lines 252 having the line width W4 and extending in the X-direction are positioned inside the row ROWy of the cell array 100A_1 and between the metal lines 256b and 256c. In some embodiments, the line width W4 is less than the line width W2. In some embodiments, the line width W4 is within a range of 5 nm~20 nm.

In the cell array 100A_1, the metal lines 252, 254 and 256 are formed in the same metal layer. Furthermore, the width ratio of the line width W2 of the metal lines 254 to the line width W4 of the metal lines 252 is within a range of 1.05 to 2. Furthermore, the material of the metal lines 252, 254 and 256 is selected from a group consisting of Ti, TiN, TaN, Co, Ru, Pt, Ni, W, Al, Cu, or a combination thereof.

In FIG. 4B, four metal lines 252a through 252d with the line width W4 are positioned inside the second logic cell 20B_1 and between the metal lines 256b and 256c. In the second logic cell 20B_1, the metal line 256b is coupled to the contact 240k through the second via 244h, and the metal line 256c is coupled to the contact 240n through the second via 244i. Furthermore, the metal line 252a is arranged between the metal line 256b and the metal line 252b. The metal line 252a is coupled to the contact 240j through the first via 242a, and the metal line 252b is coupled to the metal gate electrode 220d through the gate via 235d. The metal line 252d is arranged between the metal line 252c and metal line 256c, and the metal line 252d is coupled to the contact 240m through the first via 242b.

In some embodiments, a quantity of the metal lines 254 inside each first logic cell 10 is greater than a quantity of the metal lines 252 inside each second logic cell 20. For example, the number of metal lines 254 with the line width W2 inside each of the first logic cells 10A_1 and 10B_1 is equal and is 5, and the number of metal lines 252 with the line width W4 inside each of the second logic cells 20A_1 and 20B_1 is equal and is 4.

In the first logic cells 10A_1 and 10A_2, the wider metal lines 254 and the larger vias (e.g., 244b, 244c, 244f and 244g of FIG. 4B) are used to handle the high drive current induced IR drop concern. Furthermore, in the second logic cells 20A_1 and 20A_2, the narrower metal lines 252 and the smaller vias (e.g., 242a through 242d of FIG. 4B) are used for density improvement of IC.

FIG. 4C illustrates a cross-sectional view of the semiconductor structure of the cell array 100A_1 along line A-AA in FIG. 4B, in accordance with some embodiments of the disclosure. Referring to FIGS. 4A through 4C together, the P-type well region PW2 is formed over a substrate 200. In some embodiments, the substrate 200 is a Si substrate. In some embodiments, the material of the substrate 200 is selected from a group consisting of bulk-Si, SiP, SiGe, SiC, SiPC, Ge, SOI-Si, SOI-SiGe, III-VI material, or a combination thereof.

The semiconductor fins 210k and 210l are formed on the P-type well region PW2. Furthermore, the dielectric-base dummy gates 225d and 225e are arranged upon the left edge and right edge of the semiconductor fin 210k, and the dielectric-base dummy gates 225e and 225f are arranged upon the left edge and right edge of the semiconductor fin 210l. Furthermore, the semiconductor fins 210k and 210l are separated from each other by the dielectric-base dummy gate 225e.

The contacts 240m and 240n over the semiconductor fin 210k form the source/drain regions of the NMOS transistor N3 of the second logic cell 20B_1. The contact 240m is coupled to the metal line 252d through the first via 242b. The metal gate electrode 220d is formed over the gate dielectrics (not shown) and is positioned over the top surface of the semiconductor fin 210k and between the contacts 240m and 240n. The semiconductor fin 210k overlapping the metal gate electrode 220d, may serve as a channel region of the NMOS transistor N3 in the second logic cell 20B_1.

The contacts 240o and 240q over the semiconductor fin 210l form the source/drain regions of the NMOS transistor N2 of the second logic cell 20A_1, and the contacts 240q and 240p over the semiconductor fin 210l form the source/drain regions of the NMOS transistor N1 of the second logic cell 20A_1. The contact 240p is coupled to the metal line 252e through the first via 242d. The metal gate electrode 220e is formed over the gate dielectrics (not shown) and is positioned over the top surface of the semiconductor fin 210l and between the contacts 240o and 240q. The semiconductor fin 210l overlapping the metal gate electrode 220e, may serve as a channel region of the NMOS transistor N2 in the second logic cell 20A_1. The metal gate electrode 220f is formed over the gate dielectrics (not shown) and is positioned over the top surface of the semiconductor fin 210l and between the contacts 240q and 240p. The semiconductor fin 210l overlapping the metal gate electrode 220f may serve as a channel region of the NMOS transistor N1 in the second logic cell 20A_1.

In some embodiments, the source/drain regions of the PMOS transistors in the first logic cells 10 and the second logic cells 20 are formed by epitaxy material, and the epitaxy material is selected from a group consisting of SiGe, SiGeC, Ge, Si, or a combination thereof. In some embodiments, the source/drain regions of the NMOS transistors in the first logic cells 10 and the second logic cells 20 are formed by epitaxy material, and the epitaxy material is selected from a group consisting of SiP content, SiC content, SiPC, Si, or a combination thereof.

In some embodiments, the channel regions of the PMOS transistors in the first logic cells 10 and the second logic cells 20 include SiGe channel region. In some embodiments, the Ge atomic concentration of the SiGe channel region of the PMOS transistors is within a range of 10%~40%.

In some embodiments, the fin height of the semiconductor fins 210a through 210l is within a range of 60 nm~300 nm, and the fin thickness of the semiconductor fins 210a through 210l is within a range of 3 nm~15 nm. Furthermore, the channel region under the semiconductor fins 210a through 210l is within a range of 40 nm~80 nm.

Figure 5:
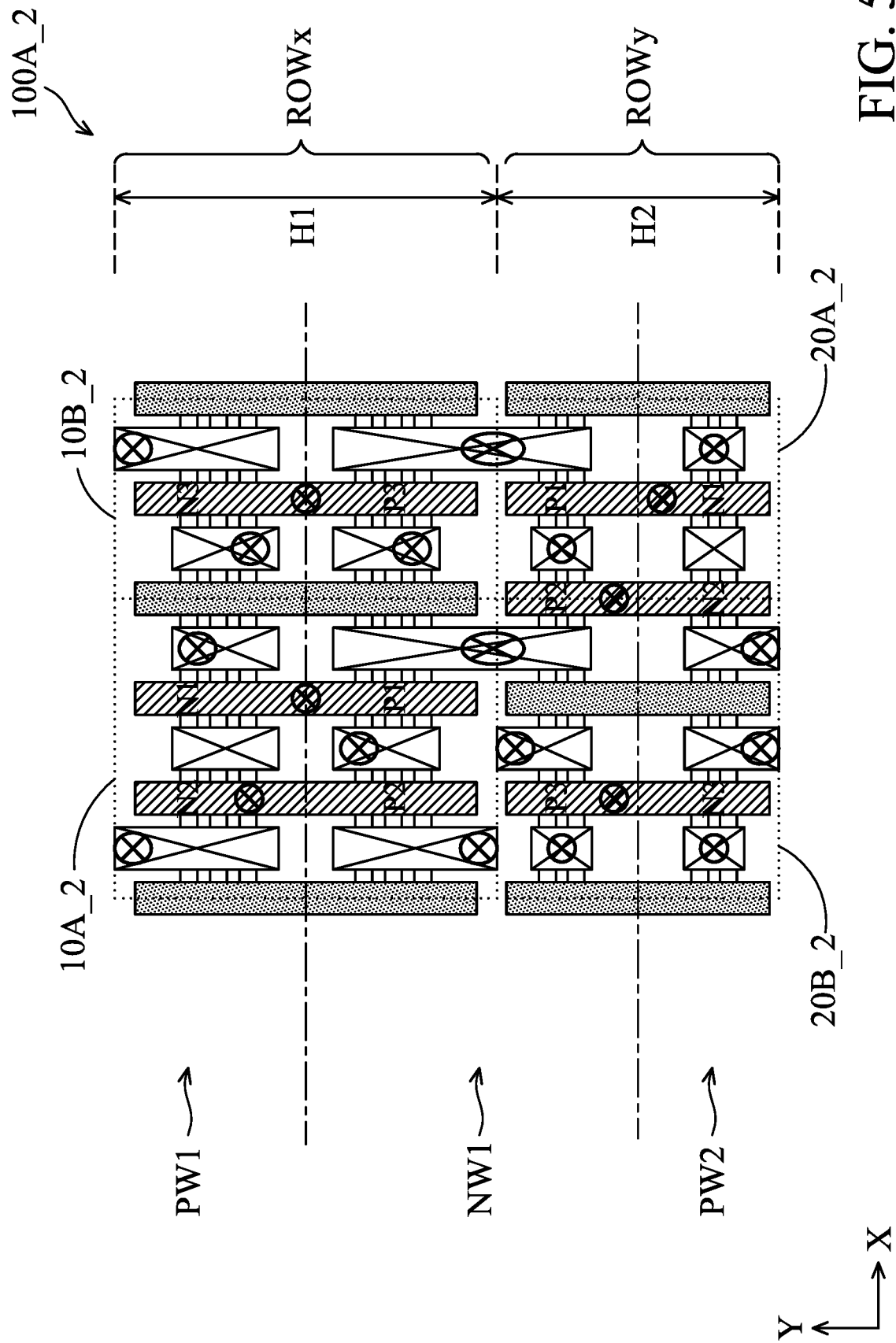
FIG. 5 illustrates block diagrams of a layout of features of the logic cells in the cell array in a via level and lower, in accordance with some embodiments of the disclosure.

FIG. 5 illustrates a block diagram of a layout of features of the logic cells in a cell array 100A_2 in a via level and lower, in accordance with some embodiments of the disclosure. The semiconductor structure of the cell array 100A_2 is similar to the semiconductor structure of the cell array 100A_1 of FIG. 4A, and the differences between FIG. 5 and FIG. 4A is that the transistors of the first logic cells 10A_2 and 10B_2 are triple-fin FETs, and the transistors of the second logic cells 20A_2 and 20B_2 are dual-fin FETs as shown in FIG. 5.

In the first logic cells 10A_2 and 10B_2, the wider metal lines and the larger vias are used to handle the high drive current induced IR drop concern. Furthermore, in the second logic cells 20A_2 and 20B_2, the narrower metal lines and the smaller vias are used for density improvement. In some embodiments, the arrangement/configuration of the metal lines of the first logic cells 10A_2 and 10B_2 and the second logic cells 20A_2 and 20B_2 are similar to the metal lines 252, 254 and 256 in FIG. 4B.

Figure 6:
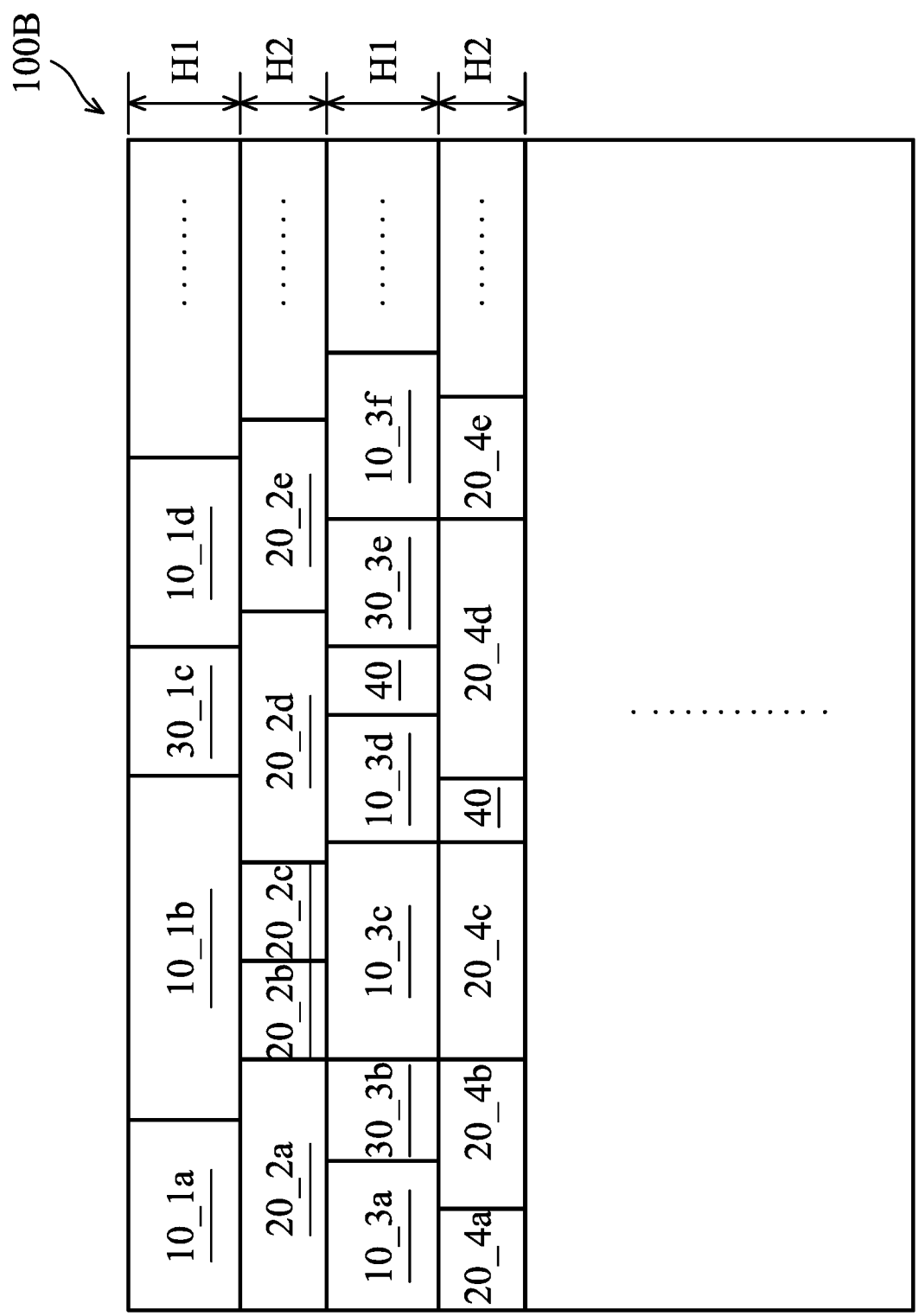
FIG. 6 is a simplified diagram of a cell array of an IC, in accordance with some embodiments of the disclosure.

FIG. 6 is a simplified diagram of a cell array 100B of an IC, in accordance with some embodiments of the disclosure. The cell array 100B includes multiple first logic cells 10, multiple second logic cells 20 and multiple third logic cells 30. In some embodiments, the first logic cells 10, the second logic cells 20 and the third logic cells are the standard cells (e.g., inverter (INV), AND, OR, NAND, NOR, Flip-Flop, SCAN, etc.), a combination thereof or specific functional cells. Furthermore, the logic functions of the first logic cells 10, the second logic cells 20 and the third logic cells 30 may be the same or different. Furthermore, each of the first logic cells 10, the second logic cells 20 and third logic cells 30 includes multiple transistors. In some embodiments, the first logic cells 10, the second logic cells 20, and third logic cells 30 corresponding to the same function or operation may have the same circuit configuration with different semiconductor structures and/or different layout.

In FIG. 6, the first logic cells 10 and the third logic cells 30 have the same cell width H1 (e.g., along Y-direction) in the layout, and the second logic cells 20 have the same cell height H2 (e.g., along Y-direction) in the layout. The cell width H1 of the first logic cells 10 and the third logic cells 30 is higher than the cell width H2 of the second logic cells 20. In some embodiments, the dimension ratio of the cell width H1 to the cell width H2 is within a range of about 1.1 to about 2. Furthermore, the first logic cells 10, the second logic cells 20 and the third logic cells 30 may have the same or different cell widths (e.g., along X-direction) in the layout. It should be noted that the number and the configuration of the first logic cells 10, the second logic cells 20, and the third logic cells 30 are used as an example, and not to limit the disclosure.

In some embodiments, the first logic cells 10 and the third logic cells 30 are arranged in odd rows of the cell array 100B. For example, the first logic cells 10_1a, 10_1b and 10_1d and the third logic cell 30_1c are arranged in the first row of the cell array 100B, and the first logic cells 10_3a, 10_3c, 10_3d and 10_3f and the third logic cells 30_3b and 30_3e are arranged in the third row of the cell array 100B. Furthermore, the second logic cells 20 are arranged in even rows of the cell array 100B. For example, the second logic cells 20_2a through 20_2e are arranged in the second row of the cell array 100B, and the second logic cells 20_4a through 20_4e are arranged in the fourth row of the cell array 100B.

In some embodiments, the first logic cells 10 and the third logic cells 30 are arranged in even rows of the cell array 100B, and the second logic cells 20 are arranged in odd rows of the cell array 100B.

In some embodiments, the cells other than the first logic cells 10, the second logic cells 20 and the third logic cells 30 are arranged in the rows of the cell array 100B. For example, the cell 40 is arranged between the first logic cells 10_3d and the third logic cells 30_3e in the third row of the cell array 100B. In some embodiments, the cell 40 is a dummy cell or a well tap cell.

In some embodiments, the transistors in the first logic cells 10, the second logic cells 20 and the third logic cells 30 are selected from a group consisting of FINFET structure, vertical gate all around (GAA), horizontal GAA, nano wire, nano sheet, or a combination thereof.

In some embodiments, the first logic cells 10, the second logic cells 20 and/or the third logic cells 30 in the same row are electrically isolated from each other by the isolation region, e.g., the shallow trench isolation (STI). In some embodiments, the first logic cells 10, the second logic cells 20 and/or the third logic cells 30 in the same row are electrically isolated by the transistors.

Figure 7A:
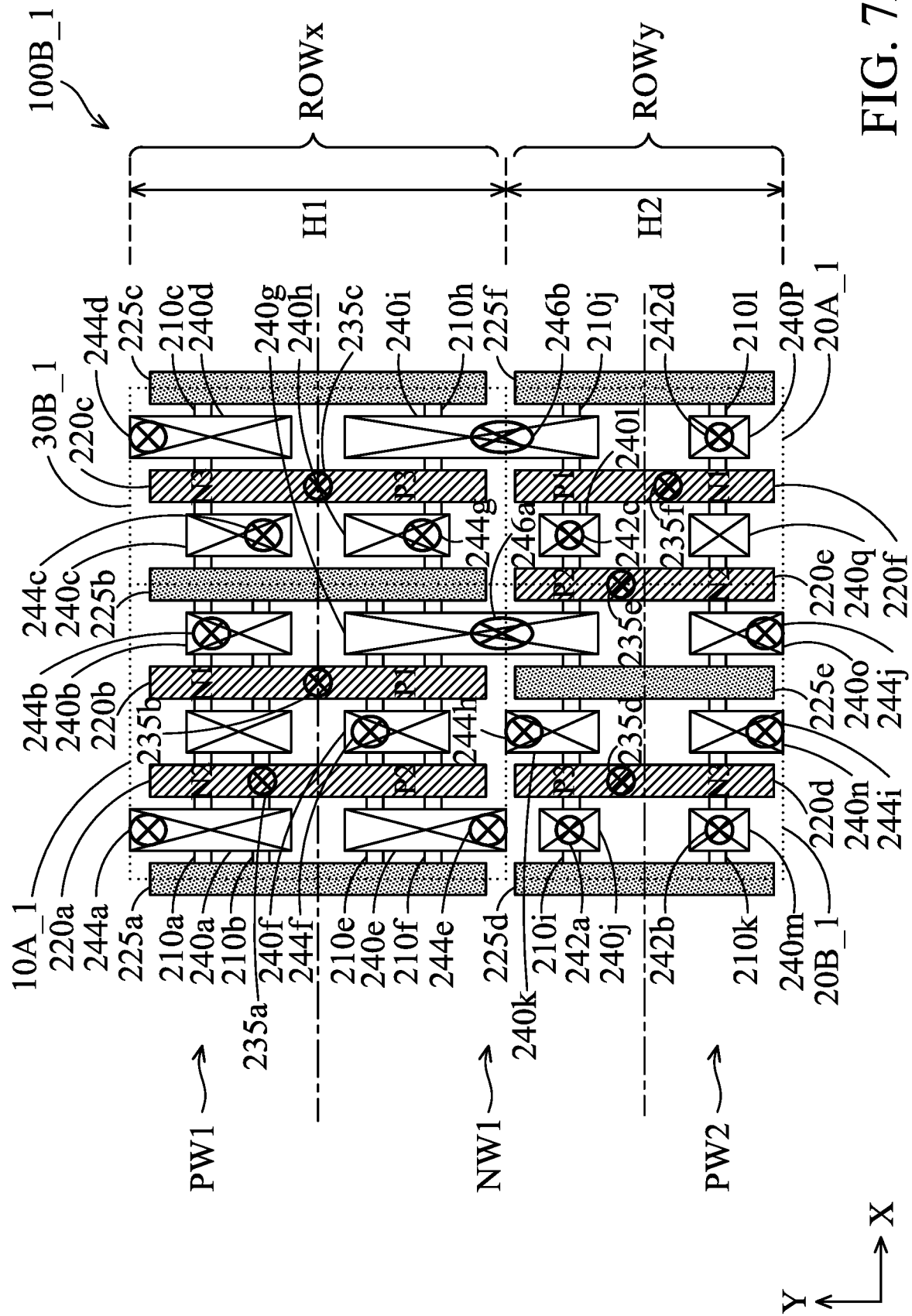

FIGS. 7A through 7B illustrate block diagrams of a layout of features of the logic cells in the cell array 100B_1, in accordance with some embodiments of the disclosure. FIGS. 7A and 7B illustrates features in various levels of the cell array 100B_1.

FIG. 7A shows features of the cell array 100B_1 in a via level and lower. In FIG. 7A, the first logic cell 10A_1 and the third logic cell 30B_1 are arranged in the row ROWx of the cell array 100B_1, and the second logic cells 20A_1 and 20B_1 are arranged in the ROWy of the cell array 100B_1. Furthermore, the outer boundary of each of the logic cells 10A_1, 30B_1, 20A_1 and 20B_1 is illustrated using dashed lines. As described above, the cell height H1 of the first logic cell 10A_1 and the third logic cell 30B_1 is higher than the cell height H2 of the second logic cells 20A_1 and 20B_1. It should be noted that the configuration of the logic cells in the rows ROWx and ROWy is used as an illustration, and not to limit the disclosure.

In FIG. 7A, the standard cell NAND of FIGS. 2A and 2B is implemented in the first logic cell 10A_1 and the second logic cell 20A_1. Furthermore, the standard cell INV of FIGS. 3A and 3B is implemented in the third logic cell 30B_1 and the second logic cell 20B_1. In the embodiment, the transistors of the first logic cell 10A_1 are dual-fin FETs, and the transistors of the second logic cells 20A_1 and 20B_1 and the third logic cell 30B_1 are single-fin FETs.

In the first logic cell 30B_1, the semiconductor fin 210c extending in the X-direction is formed over the P-type well region PW1, and the semiconductor fin 210h extending in the X-direction is formed over the N-type well region NW1. A metal gate electrode 220c extending in the Y-direction forms the PMOS transistor P3 with an underlying active region formed by the semiconductor fin 210h over the N-type well region NW1. In some embodiments, the semiconductor fin 210h overlapping the metal gate electrode 220c may serve as a SiGe channel region of the PMOS transistor P3. In some embodiments, the Ge atomic concentration of the SiGe channel region of the PMOS transistor P3 is within a range of 5%~50%.

Furthermore, the metal gate electrode 220c forms the NMOS transistor N3 with an underlying active region formed by the semiconductor fin 210c in the P-type well region PW1. In other words, the metal gate electrode 220c is shared by the NMOS transistor N3 and the PMOS transistor P3. Furthermore, the metal gate electrode 220c is connected to an overlying level through the gate via 235c for receiving the input signal IN of the standard cell INV corresponding to the first logic cell 30B_1.

In some embodiments, the single-fin FETs are formed by removing an extra fin from multiple fins using lithography/etch steps. In some embodiments, the first logic cell 10 including dual-fin FETs are used in high-speed circuits.

Furthermore, the second logic cell 20 including single-fin FETs are used in non speed-critical circuits to obtain lower leakage and lower power consumption. Compared with the cell array 100A_1 of FIG. 4A, the first logic cell 10 including dual-fin FETs and the third logic cells 30 including single-fin FETs arranged in the same row can further decrease power consumption. Therefore, the cell array 100A_1 has better cell performance and lower power consumption.

FIG. 7B shows features of the cell array 100B_1 in a metal level and lower. In some embodiments, the configuration of the metal lines 252, 254 and 256 in semiconductor structure of the cell array 100A_2 is similar to the semiconductor structure of the cell array 100A_1 of FIG. 4B.

In the cell array 100B_1 of FIG. 7B, the metal lines 252, 254 and 256 are formed in the same metal layer. Furthermore, the width ratio of the line width W2 of the metal lines 254 to the line width W4 of the metal lines 252 is within a range of 1.05 to 2. Furthermore, the material of the metal lines 252, 254 and 256 is selected from a group consisting of Ti, TiN, TaN, Co, Ru, Pt, Ni, W, Al, Cu, or a combination thereof.

In some embodiments, a quantity of the metal lines 254 inside each first logic cell 10 and each third logic cell 30 is greater than a quantity of the metal lines 252 inside each second logic cell 20. For example, the number of metal lines 254 with the line width W2 in each of the first logic cell 10A_1 and the third logic cell 30B_1 is equal and is 5, and the number of metal lines 252 with the line width W4 in each of the second logic cells 20A_1 and 20B_1 is equal and is 4.

Embodiments for semiconductor structures are provided. In a cell array, two adjacent rows have different cell heights (e.g., the cell heights H1 and H2). The first logic cells 10 including the multiple-fin transistors are arranged in the rows with higher cell height for high-speed applications. In some embodiments, the first logic cells 10 including the multiple-fin transistors and the third logic cells 30 including the single-fin transistors are arranged in the rows with higher cell height for high-speed applications, and the first logic cells 10 and the third logic cells 30 have the same cell height. The second logic cells 20 including the single-fin transistors are arranged in the row with lower cell height for power reduction. In some embodiments, the second logic cells 20 include multiple-fin transistors, and the fin number of each transistor in the second logic cell 20 is less than the fin number of each transistor in the first logic cell 10. Furthermore, the logic cells in the row with higher cell height and the logic cells in the row with lower cell height have different metal line width and different via sizes inside the logic cells for cell density and RC relay optimization in back end of line (BEOL).

In some embodiments, a semiconductor structure is provided. The semiconductor structure includes a plurality of first logic cells having a first cell height, a plurality of second logic cells having a second cell height, and a plurality of metal lines parallel to each other in a metal layer. The second cell height is different than the first cell height. The first logic cells are arranged in odd rows of a cell array, and the second logic cells are arranged in even rows of the cell array. The metal lines covering the first and second logic cells are wider than the metal lines inside the first logic cells, and the metal lines inside the first logic cells are wider than the metal lines inside the second logic cells.

In some embodiments, a semiconductor structure is provided. The semiconductor structure includes a plurality of first logic cells having a first cell height, a plurality of second logic cells having a second cell height, a plurality of third logic cells having the first cell height, and a plurality of metal lines parallel to each other in a metal layer. Each of the first logic cells includes a plurality of multiple-fin transistors. The second cell height is different than the first cell height. Each of the second logic cells includes a plurality of single-fin transistors. Each of the third logic cells includes a plurality of single-fin transistors. The first logic cells and the third logic cells are arranged in odd rows of a cell array, and the second logic cells are arranged in even rows of the cell array. The metal lines inside the first and third logic cells are wider than the metal lines inside the second logic cells.

In some embodiments, a semiconductor structure is provided. The semiconductor structure includes a plurality of first logic cells having a first cell height, and a plurality of second logic cells having a second cell height. Each of the first logic cell includes a plurality of multiple-fin transistors. The second cell height is different than the first cell height. Each of the second logic cells includes a plurality of multiple-fin transistors. The first logic cells are arranged in odd rows of a cell array, and the second logic cells are arranged in even rows of the cell array. The fin number of each of the multiple-fin transistors in the first logic cell is greater than fin number of each of the multiple-fin transistors in the second logic cell.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a plurality of first logic cells each having a first cell height;
   a plurality of second logic cells each having a second cell height that is different than the first cell height, wherein one of the plurality of second logic cells is immediately adjacent to one of the plurality of first logic cells; and
   a plurality of metal lines parallel to each other in a metal layer, and comprising a first group of metal lines inside the plurality of first logic cells, a second group of metal lines inside the plurality of second logic cells and a third group of metal lines covering the plurality of first logic cells and the plurality of second logic cells,
   wherein the plurality of first logic cells and the first group of metal lines are arranged in odd-numbered rows of a cell array, and the plurality of second logic cells and the second group of metal lines are arranged in even-numbered rows of the cell array,
   wherein the third group of metal lines are wider than the first group of metal lines in the odd-numbered rows of the cell array, and the first group of metal lines in the odd-numbered rows of the cell array have a uniform first width, the second group of metal lines in the even-numbered rows of the cell array have a uniform second width, and the first width is greater than the second width, and
   wherein the odd-numbered rows of the cell array are free of the plurality of second logic cells and the second group of metal lines, and the even-numbered rows of the cell array are free of the plurality of first logic cells and the first group of metal lines.

2. The semiconductor structure as claimed in claim 1, wherein each of the plurality of first logic cells comprises a plurality of multiple-fin transistors, and each of the plurality of second logic cells comprises a plurality of single-fin transistors, wherein the second cell height is less than the first cell height.

3. The semiconductor structure as claimed in claim 1, wherein a plurality of first vias of a via layer under and coupled to the first group of metal lines have larger size than a plurality of second vias of the via layer under and coupled to the second group of metal lines.

4. The semiconductor structure as claimed in claim 1, wherein width ratio of the third group of metal lines to the first group of metal lines is greater than 1.2, and width ratio of the first group of metal lines to the second group of metal lines is greater than 1.05.

5. The semiconductor structure as claimed in claim 1, wherein a quantity of the first group of metal lines is greater than that of the second group of metal lines.

6. The semiconductor structure as claimed in claim 1, wherein the plurality of first logic cells in one row of the cell array are isolated from each other by a dielectric material, and the plurality of second logic cells in one row of the cell array are isolated from each other by the dielectric material.

7. The semiconductor structure as claimed in claim 1, further comprising:
a plurality of dummy cells or a plurality of well tap cells formed in the odd-numbered and even-numbered rows of the cell array.

8. The semiconductor structure as claimed in claim 1, wherein each cell of the plurality of first logic cells and the plurality of second logic cells includes a PMOS transistor, and each PMOS transistor of the plurality of first logic cells and the plurality of second logic cells comprises a SiGe channel region, and Ge atomic concentration of the SiGe channel region is within a range of 5% to 50%.

9. The semiconductor structure as claimed in claim 1, wherein the plurality of first logic cells and the plurality of second logic cells are selected from a group consisting of inverter, NAND, NOR, AND, OR, Flip-Flop, SCAN, or a combination thereof.

10. A semiconductor structure, comprising:
a cell array, comprising:
a plurality of first logic cells arranged in odd-numbered rows of the cell array, each of the plurality of first logic cells having a first cell height; and
a plurality of second logic cells arranged in even-numbered rows of the cell array, each of the plurality of second logic cells having a second cell height that is different than the first cell height, wherein one of the plurality of second logic cells is immediately adjacent to one of the plurality of first logic cells,
a plurality of first metal lines formed in a metal layer and inside the plurality of first logic cells of the odd-numbered rows of the cell array;
a plurality of second metal lines formed in the metal layer and inside the plurality of second logic cells of the even-numbered rows of the cell array; and
a plurality of third metal lines formed in the metal layer and covering the plurality of first and second logic cells,
wherein the plurality of first metal lines, the plurality of second metal lines and the plurality of third metal lines are parallel to each other,
wherein each of the plurality of third metal lines is disposed between at least one of the plurality of first metal lines and at least one of the plurality of second metal lines,
wherein the plurality of first metal lines of the odd-numbered rows of the cell array have a uniform first width, the plurality of second metal lines of the even-numbered rows of the cell array have a uniform second width, and the first width is greater than the second width, and
wherein the odd-numbered rows of the cell array are free of the plurality of second logic cells and the plurality of second metal lines, and the even-numbered rows of the cell array are free of the plurality of first logic cells and the plurality of first metal lines.

11. The semiconductor structure as claimed in claim 10, wherein the plurality of third metal lines are wider than the plurality of first metal lines and the plurality of second metal lines.

12. The semiconductor structure as claimed in claim 10, wherein each of the plurality of first logic cells comprises a plurality of multiple-fin transistors, and each of the plurality of second logic cells comprises a plurality of single-fin transistors, wherein the plurality of first logic cells have larger cell height than the plurality of second logic cells.

13. The semiconductor structure as claimed in claim 10, wherein a plurality of first vias of a via layer under and coupled to the plurality of first metal lines have larger size than a plurality of second vias of the via layer under and coupled to the plurality of second metal lines.

14. The semiconductor structure as claimed in claim 10, wherein width ratio of the plurality of third metal lines to the plurality of first metal lines is greater than 1.2, and width ratio of the plurality of first metal lines to the plurality of second metal lines is greater than 1.05.

15. The semiconductor structure as claimed in claim 10, wherein a quantity of the plurality of first metal lines is greater than that of the plurality of second metal lines.

16. A semiconductor structure, comprising:
a plurality of first logic cells, each having a first cell height;
a plurality of second logic cells, each having a second cell height that is different than the first cell height, wherein one of the plurality of second logic cells is immediately adjacent to one of the plurality of first logic cells; and
a plurality of metal lines parallel to each other in a metal layer, and comprising a first group of metal lines inside the plurality of first logic cells, a second group of metal lines inside the plurality of second logic cells and a third group of metal lines covering the plurality of first and second logic cells,
wherein quantity of the first group metal lines is greater than that of the second group metal lines,
wherein the plurality of first logic cells in a plurality of first rows of a cell array are isolated from each other by a dielectric material, and the plurality of second logic cells in a plurality of second rows of the cell array are isolated from each other by the dielectric material,
wherein the plurality of first rows and the plurality of second rows are arranged alternately in the cell array,
wherein the third group of metal lines are wider than the first group of metal lines in the plurality of first rows of the cell array, and the first group of metal lines in the plurality of first rows of the cell array have a uniform first width, the second group of metal lines in the plurality of second rows of the cell array have a uniform second width, and the first width is greater than the second width, wherein the plurality of first rows of the cell array are free of the plurality of second logic cells and the second group of metal lines, and the plurality of second rows of the cell array are free of the plurality of first logic cells and the first group of metal lines.

17. The semiconductor structure as claimed in claim 16, wherein each of the plurality of first logic cells comprises a plurality of multiple-fin transistors, and each of the plurality of second logic cells comprises a plurality of single-fin transistors, wherein a cell height of the plurality of second logic cell is less than that of the plurality of first logic cell.

18. The semiconductor structure as claimed in claim 16, wherein a plurality of first vias of a via layer under and coupled to the first group of metal lines have larger size than a plurality of second vias of the via layer under and coupled to the second group of metal lines.

19. The semiconductor structure as claimed in claim 18, wherein a plurality of third vias of the via layer under and coupled to the third group of metal lines have larger size than the plurality of first vias.

20. The semiconductor structure as claimed in claim 16, wherein width ratio of the third group of metal lines to the first group of metal lines is greater than 1.2, and width ratio of the first group of metal lines to the second group of metal lines is greater than 1.05.

\* \* \* \* \*